(12) United States Patent
Patel et al.

(10) Patent No.: US 11,149,345 B2
(45) Date of Patent: Oct. 19, 2021

(54) CRYOGENICALLY COOLED ROTATABLE ELECTROSTATIC CHUCK

(71) Applicant: APPLIED MATERIALS, INC., Santa Clara, CA (US)

(72) Inventors: Shardul Patel, Chelmsford, MA (US); Robert Mitchell, Winchester, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 565 days.

(21) Appl. No.: 15/838,314

(22) Filed: Dec. 11, 2017

(65) Prior Publication Data
US 2019/0181028 A1    Jun. 13, 2019

(51) Int. Cl.
*C23C 14/50* (2006.01)
*C23C 16/46* (2006.01)
(Continued)

(52) U.S. Cl.
CPC ........ *C23C 14/505* (2013.01); *C23C 16/4586* (2013.01); *C23C 16/463* (2013.01);
(Continued)

(58) Field of Classification Search
CPC ..... C23C 14/505; C23C 14/50; C23C 14/541; C23C 16/4586; C23C 16/463; H01J 37/32724; H01J 37/3411; H01J 37/3488; H01J 37/32715; H01L 21/6831; H01L 21/6833; H01L 21/68792; H01L 21/68785;
(Continued)

(56) References Cited

U.S. PATENT DOCUMENTS 6,081,414 A    6/2000 Flanigan et al.
6,439,244 B1   8/2002 Wu
(Continued)

FOREIGN PATENT DOCUMENTS

WO    WO 2016-148327 A1    9/2016
WO    WO-2019009118 A1 *  1/2019    ............. C23C 16/46

OTHER PUBLICATIONS

"Cryogenics" definition. https://www.merriam-webster.com/dictionary/cryogenic [Accessed on Apr. 21, 2020].*
(Continued)

*Primary Examiner* — Michael A Band
(74) *Attorney, Agent, or Firm* — Moser Taboada

(57) ABSTRACT

Embodiments of the present disclosure relate to a rotatable electrostatic chuck. In some embodiments, a rotatable electrostatic chuck includes a dielectric disk having at least one chucking electrode and a plurality of coolant channels; a cryogenic manifold coupled to the dielectric disk and having a coolant inlet and a coolant outlet both of which are fluidly coupled to the plurality of coolant channels; a shaft assembly coupled to the cryogenic manifold; a cryogenic supply chamber coupled to the shaft assembly; a supply tube coupled to the cryogenic supply chamber and to the coolant inlet to supply the cryogenic medium to the plurality of coolant channels, wherein the supply tube extends through the central opening of the shaft assembly; and a return tube coupled to the coolant outlet and to the cryogenic supply chamber, wherein the supply tube is disposed within the return tube.

18 Claims, 4 Drawing Sheets

(51) Int. Cl.

| | |
|---|---|
| *C23C 16/458* | (2006.01) |
| *H01J 37/32* | (2006.01) |
| *H01J 37/34* | (2006.01) |
| *H01L 21/02* | (2006.01) |
| *H01L 21/687* | (2006.01) |
| *H02N 13/00* | (2006.01) |
| *H01L 21/683* | (2006.01) |
| *H01L 21/67* | (2006.01) |

(52) U.S. Cl.
CPC ..... *H01J 37/32724* (2013.01); *H01J 37/3411* (2013.01); *H01J 37/3488* (2013.01); *H01L 21/6831* (2013.01); *H01L 21/6833* (2013.01); *H01L 21/68742* (2013.01); *H01L 21/68785* (2013.01); *H01L 21/68792* (2013.01); *H02N 13/00* (2013.01); *H01L 21/02266* (2013.01); *H01L 21/67103* (2013.01)

(58) Field of Classification Search
CPC ........ H01L 21/68742; H01L 21/02266; H02N 13/00
See application file for complete search history.

(56) References Cited

U.S. PATENT DOCUMENTS

| | | | |
|---|---|---|---|
| 7,589,950 B2* | 9/2009 | Parkhe | ............... H01L 21/6831 279/128 |
| 8,182,660 B2* | 5/2012 | Miura | ................... C23C 14/505 156/345.1 |
| 8,390,980 B2* | 3/2013 | Sansoni | .............. H01L 21/6833 361/234 |
| 2011/0020545 A1 | 1/2011 | Kim et al. | |
| 2015/0129165 A1 | 5/2015 | Parkhe et al. | |
| 2015/0170952 A1 | 6/2015 | Subramani et al. | |
| 2017/0125274 A1 | 5/2017 | Swaminathan et al. | |
| 2018/0174880 A1 | 6/2018 | Swaminathan et al. | |

OTHER PUBLICATIONS

"Cryogenics" definition. https://en.wikipedia.org/wiki/Cryogenics [Accessed on Apr. 21, 2020].*
Machine Translation WO 2016148327 A1 (Year: 2016).*
International Search Report and Written Opinion dated Apr. 1, 2019 for PCT Application No. PCT/US2018/064674.

* cited by examiner

CRYOGENICALLY COOLED ROTATABLE ELECTROSTATIC CHUCK

FIELD

Embodiments of the present disclosure generally relate to electrostatic chucks used to retain substrates in microelectronic device fabrication processes.

BACKGROUND

Formation of some devices on substrates requires multiple layers of thin films which are deposited in a deposition chamber, such as a physical vapor deposition (PVD) chamber. In some embodiments, the substrate needs to be rotated during the deposition process to obtain good film uniformity. Deposition of some layers may also require the substrate to be cooled. Further, the deposition process requires a high vacuum pressure. An electrostatic chuck is often used to electrostatically retain a substrate on a substrate support during the deposition process. Conventionally, an electrostatic chuck comprises a ceramic body having one or more electrodes disposed therein. Typical rotatable electrostatic chucks are only capable of at room temperature or a higher temperature. However, the inventors have observed that some processes require the substrate to be cooled to temperatures significantly lower than possible with current electro-static chucks.

Therefore, the inventors have provided embodiments of an improved rotatable electrostatic chuck.

SUMMARY

Embodiments of the present disclosure relate to a rotatable electrostatic chuck. In some embodiments, an electrostatic chuck includes a dielectric disk having a support surface to support a substrate and an opposing second surface, wherein at least one chucking electrode is disposed within the dielectric disk between the support surface and the second surface, and wherein a plurality of coolant channels are disposed within the dielectric disk; a cryogenic manifold coupled to the second surface of the dielectric disk and having coolant inlet and a coolant outlet both of which are fluidly coupled to the plurality of coolant channels; a shaft assembly coupled to the cryogenic manifold at a first end of the shaft assembly, wherein the shaft assembly includes a central opening extending through the shaft assembly; a cryogenic supply chamber coupled to the shaft assembly at a second end of the shaft assembly opposite the first end; a supply tube coupled to the cryogenic supply chamber at a first end of the supply tube to receive a cryogenic medium and to the coolant inlet at a second end of the supply tube to supply the cryogenic medium to the plurality of coolant channels, wherein the supply tube extends through the central opening and is concentric with the shaft assembly; and a return tube coupled to the coolant outlet at a first end of the return tube and to the cryogenic supply chamber at a second end of the return tube to return the cryogenic medium to the cryogenic supply chamber after the cryogenic medium has flowed through the plurality of coolant channels, wherein the return tube extends through the central opening and is concentric with the supply tube, and wherein the supply tube is disposed within the return tube.

In some embodiments, an electrostatic chuck includes a dielectric disk having a support surface to support a substrate and an opposing second surface, wherein at least one chucking electrode is disposed within the dielectric disk between the support surface and the second surface, and wherein a plurality of coolant channels are disposed within the dielectric disk; a cryogenic manifold coupled to the second surface of the dielectric disk and having coolant inlet and a coolant outlet both of which are fluidly coupled to the plurality of coolant channels; a shaft assembly coupled to the cryogenic manifold at a first end of the shaft assembly, wherein the shaft assembly includes a central opening extending through the shaft assembly; a cryogenic supply chamber coupled to the shaft assembly at a second end of the shaft assembly opposite the first end; a vacuum pump fluidly coupled to the cryogenic supply chamber to maintain the cryogenic supply chamber at vacuum pressure; a supply tube coupled to the cryogenic supply chamber at a first end of the supply tube to receive a cryogenic medium and to the coolant inlet at a second end of the supply tube to supply the cryogenic medium to the plurality of coolant channels, wherein the supply tube extends through the central opening and is concentric with the shaft assembly; a thermally insulative layer disposed on an outer surface of the supply tube; a return tube coupled to the coolant outlet at a first end of the return tube and to the cryogenic supply chamber at a second end of the return tube to return the cryogenic medium to the cryogenic supply chamber after the cryogenic medium has flowed through the plurality of coolant channels, wherein the return tube extends through the central opening and is concentric with the supply tube, and wherein the supply tube is disposed within the return tube; a slip ring coupled to the second end of the shaft assembly to facilitate coupling power from a power source to the at least one chucking electrode; and a driving assembly coupled to the shaft assembly to rotate the shaft assembly and the dielectric disk.

In some embodiments, a process chamber includes a chamber body having an interior volume; and an electrostatic chuck disposed within a lower portion of the interior volume. The electrostatic chuck includes a dielectric disk having a support surface to support a substrate and an opposing second surface, wherein at least one chucking electrode is disposed within the dielectric disk between the support surface and the second surface, and wherein a plurality of coolant channels are disposed within the dielectric disk; a cryogenic manifold coupled to the second surface of the dielectric disk and having coolant inlet and a coolant outlet both of which are fluidly coupled to the plurality of coolant channels; a shaft assembly coupled to the cryogenic manifold at a first end of the shaft assembly, wherein the shaft assembly includes a central opening extending through the shaft assembly; a cryogenic supply chamber coupled to the shaft assembly at a second end of the shaft assembly opposite the first end; a supply tube coupled to the cryogenic supply chamber at a first end of the supply tube to receive a cryogenic medium and to the coolant inlet at a second end of the supply tube to supply the cryogenic medium to the plurality of coolant channels, wherein the supply tube extends through the central opening and is concentric with the shaft assembly; and a return tube coupled to the coolant outlet at a first end of the return tube and to the cryogenic supply chamber at a second end of the return tube to return the cryogenic medium to the cryogenic supply chamber after the cryogenic medium has flowed through the plurality of coolant channels, wherein the return tube extends through the central opening and is concentric with the supply tube, and wherein the supply tube is disposed within the return tube.

Other and further embodiments of the disclosure are described in greater detail below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
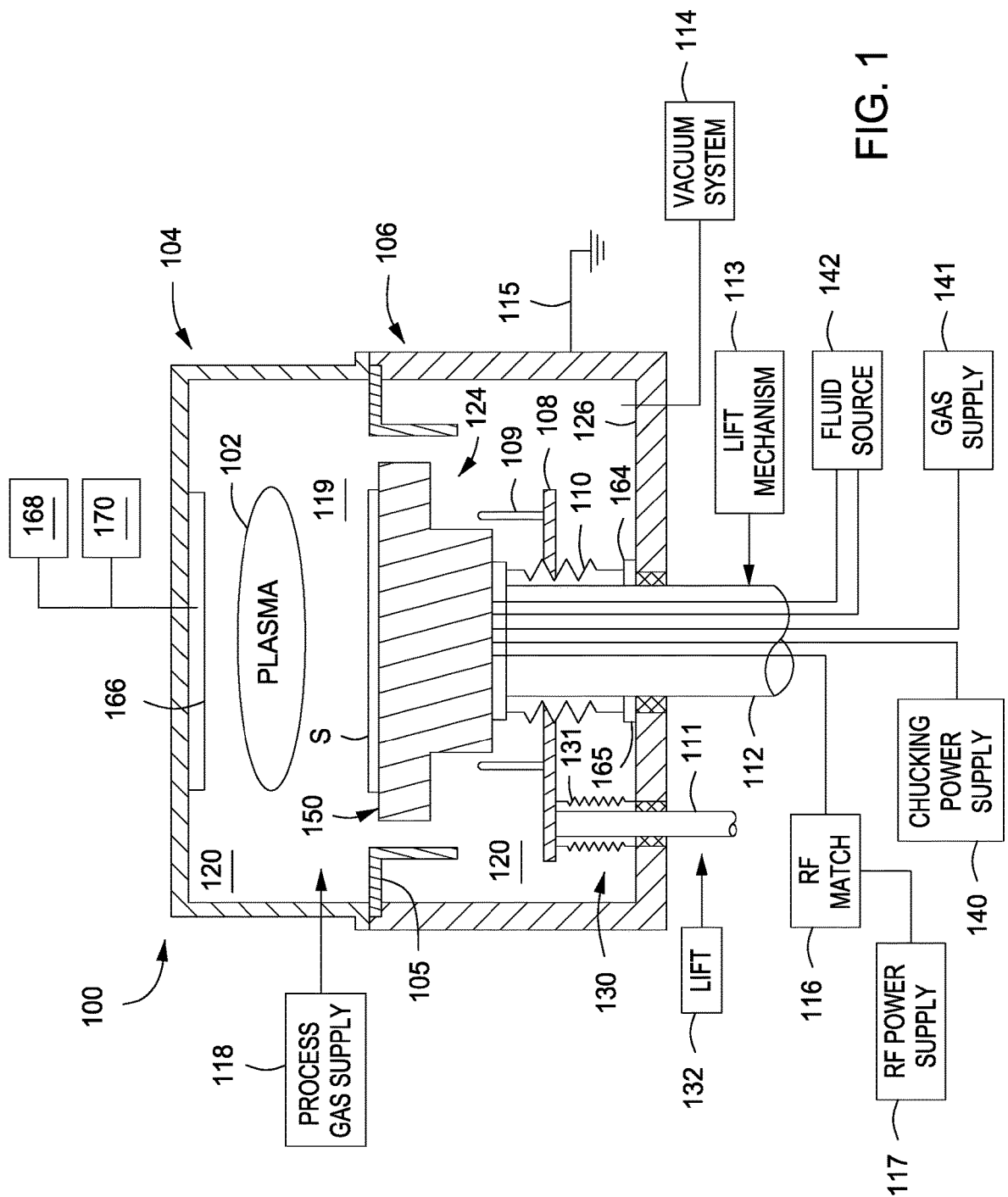
FIG. 1 depicts a schematic side view of process chamber suitable having an electrostatic chuck in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of rotatable electrostatic chuck (ESC) having a cryogenic cooling functionality are provided herein. The inventive electrostatic chuck provides cryogenic cooling medium to a rotating ESC, thus advantageously allowing for a rotating ESC to be used in processes requiring lower temperatures than possible using conventional cooling methods with conventional rotatable ESCs.

FIG. 1 is a schematic cross-sectional view of process chamber (e.g., a plasma processing chamber) in accordance with some embodiments of the present disclosure. In some embodiments, the plasma processing chamber is a physical vapor deposition (PVD) processing chamber. However, other types of processing chambers configured for different processes can also use or be modified for use with embodiments of the inventive electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate S, such as a semiconductor wafer, for example, or other such substrate as may be electrostatically retained. The substrate support 124 may generally comprise an electrostatic chuck 150 (described in more detail below with respect to FIGS. 2A-B) and a hollow support shaft 112 for supporting the electrostatic chuck 150. The hollow support shaft 112 provides a conduit to provide, for example, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts bottom surface 126 to help prevent loss of chamber vacuum.

The hollow support shaft 112 provides a conduit for coupling a fluid source 142, a gas supply 141, a chucking power supply 140, and RF sources (e.g., RF plasma power supply 170 and RF bias power supply 117) to the electrostatic chuck 150. In some embodiments, RF plasma power supply 170 and RF bias power supply 117 are coupled to the electrostatic chuck via respective RF match networks (only RF match network 116 shown). In some embodiments, the substrate support may alternatively include AC, DC, or RF bias power.

A substrate lift 130 may include lift pins 109 mounted on a platform 108 connected to a shaft 111 which is coupled to a second lift mechanism 132 for raising and lowering the substrate lift 130 so that the substrate "S" may be placed on or removed from the electrostatic chuck 150. The electrostatic chuck 150 includes thru-holes to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes proximate to or within the chamber interior volume 120 to ignite the process gas and creating the plasma 102. In some embodiments, a bias power may also be provided from a bias power supply (e.g., RF bias power supply 117) to one or more electrodes (described below) disposed within the electrostatic chuck 150 via a capacitively coupled bias plate (described below) to attract ions from the plasma towards the substrate S.

In some embodiments, for example where the chamber 100 is a PVD chamber, a target 166 comprising a source material to be deposited on a substrate S may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a negative voltage, or bias, to the target 166. The RF bias power supply 117 may be coupled to the substrate support 124 in order to induce a negative DC bias on the substrate S. In addition, in some embodiments, a negative DC self-bias may form on the substrate S during processing. In some embodiments, an RF plasma power supply 170 may also be coupled to the chamber 100 to apply RF power to the target 166 to facilitate control of the radial distribution of a deposition rate on substrate S. In operation, ions in the plasma 102 created in the chamber 100 react with the source material from the target 166. The reaction causes the target 166 to eject atoms of the source material, which are then directed towards the substrate S, thus depositing material.

Figure 2A:
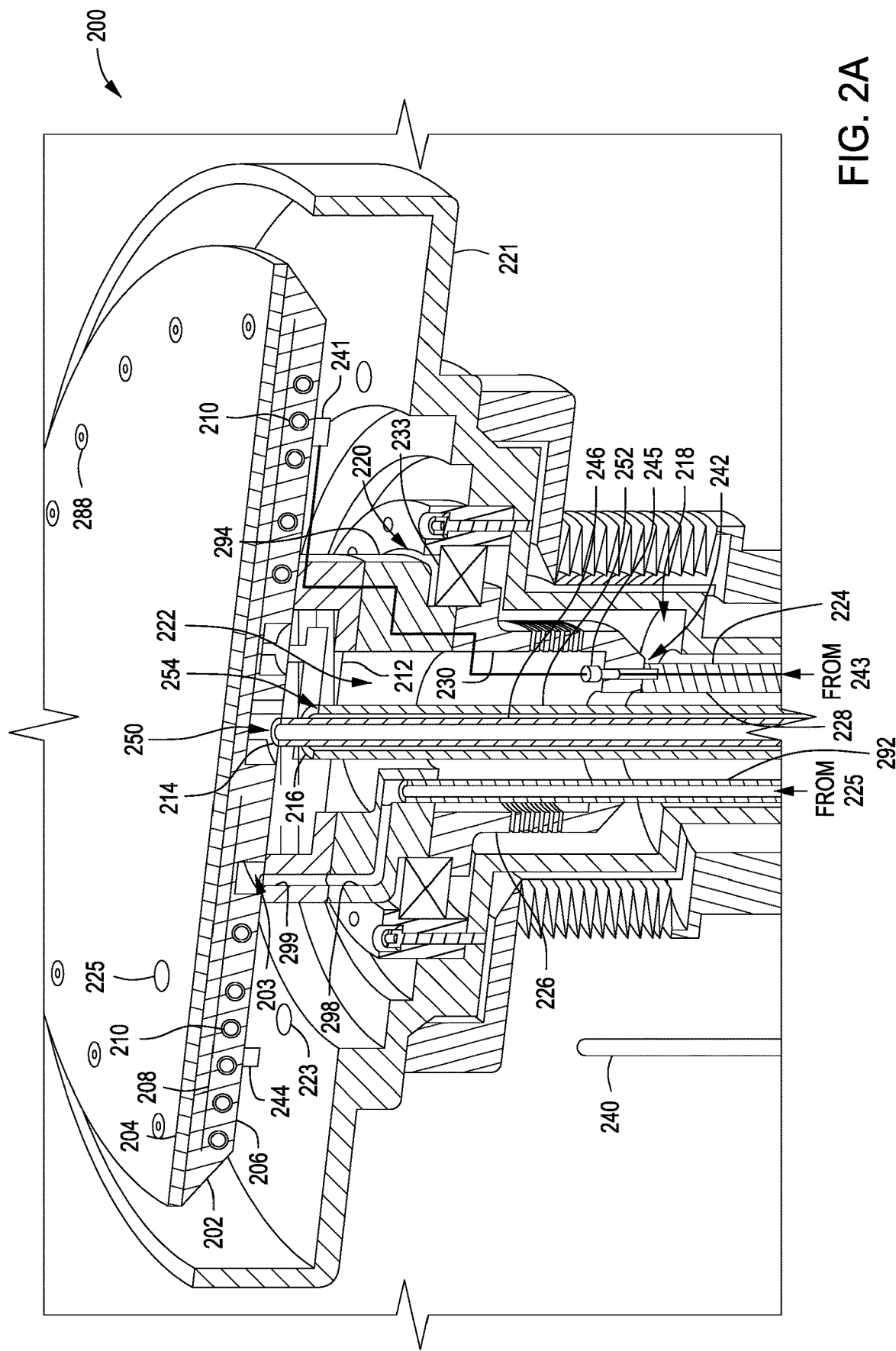
FIG. 2A depicts a schematic cross-sectional view of an upper portion of an electrostatic chuck in accordance with at least some embodiments of the present disclosure.
Figure 2B:
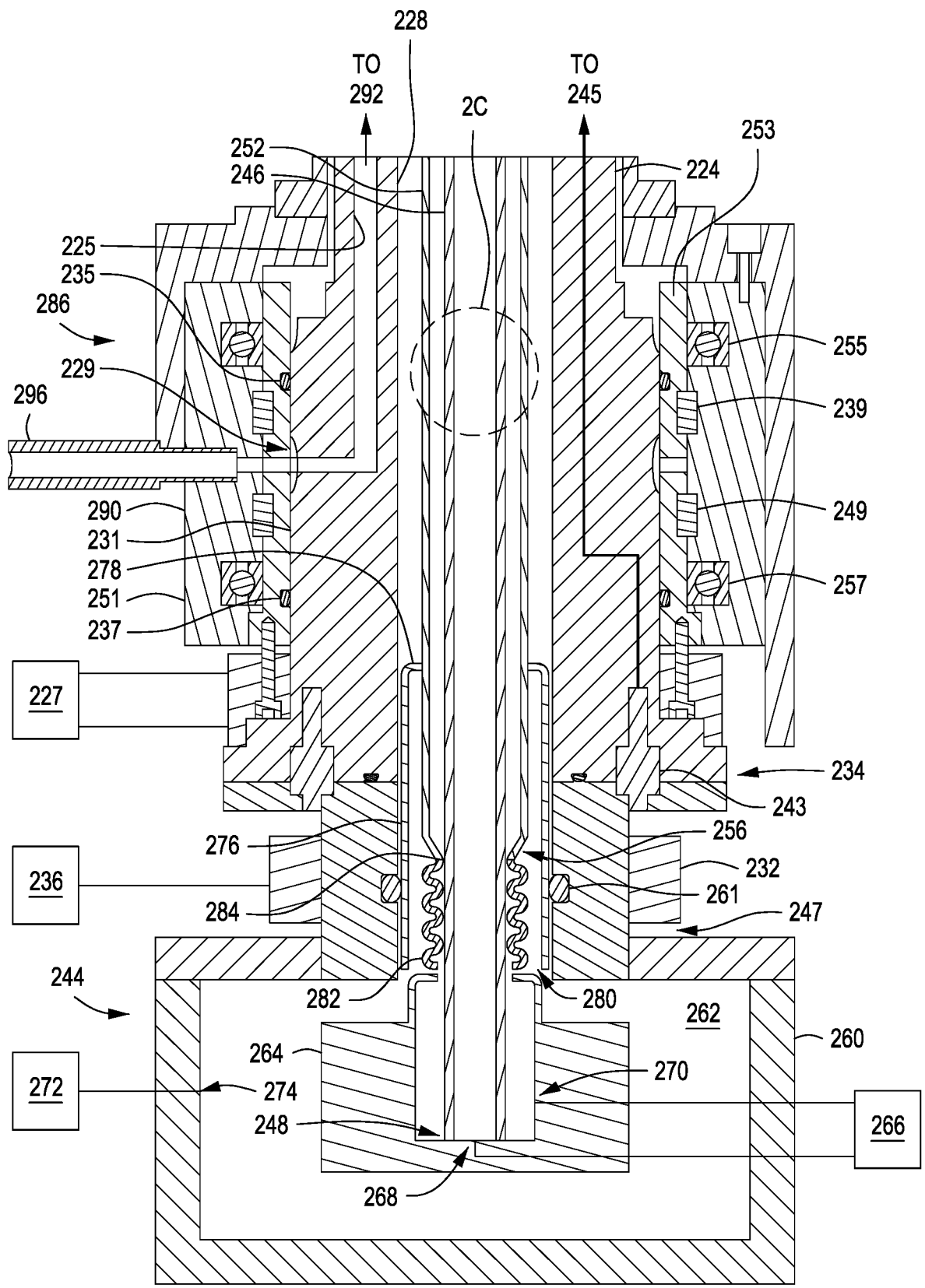
FIG. 2B depicts a schematic cross-sectional view of a lower portion of an electrostatic chuck in accordance with at least some embodiments of the present disclosure.
Figure 2C:
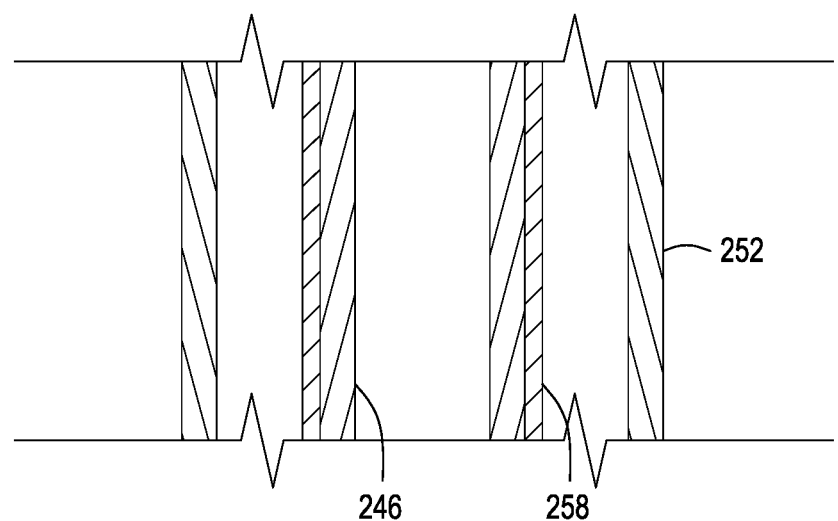
FIG. 2C depicts a close-up schematic cross-sectional view of a portion of the electrostatic chuck of FIG. 2B.

The following description will be made with reference to FIGS. 2A-C. FIG. 2A depicts a schematic cross-sectional view of an upper portion of an electrostatic chuck 200 in accordance with at least some embodiments of the present disclosure. FIG. 2B depicts a schematic cross-sectional view of a lower portion of the electrostatic chuck 200 in accordance with at least some embodiments of the present disclosure. FIG. 2C depicts a close-up schematic cross-sectional view of a portion of the electrostatic chuck of FIG. 2B. The electrostatic chuck 200 includes a dielectric disk 202 having a support surface 204 to support a substrate, an opposing second surface 206, and at least one chucking electrode 208 disposed within the dielectric disk 202 between the support surface 204 and the second surface 206. The dielectric disk 202 further includes a plurality of coolant channels 210 disposed also within the dielectric disk 202 between the support surface 204 and the second surface 206. The plurality of coolant channels 210 may be formed in the dielectric disk 202 or may include non-permeable tubing to prevent leakage of the cryogenic medium. As depicted in FIG. 2A, the upper portion of the electrostatic chuck 200 is disposed within a housing 221 having a dish-like shape. The housing 221 also includes additional features necessary in a process flow such as, for example, housing lift pin holes 223 (one shown in FIG. 2A) which are aligned with corresponding disk lift pin holes 225 to allow corresponding lift pins 240 (one shown in FIG. 2A) to pass and lift a substrate off of the support surface 204.

In some embodiments, a cryogenic manifold 212 is coupled to the second surface 206 of the dielectric disk 202. The cryogenic manifold 212 includes a coolant inlet 214 and a coolant outlet 216, both of which are fluidly coupled to the plurality of coolant channels 210. A shaft assembly 218 is coupled to the cryogenic manifold 212 at a first end 220 of the shaft assembly 218. The shaft assembly 218 includes a central opening 222 extending through the shaft assembly 218 through which the cryogenic medium supply/return tubes (discussed below) extend. The shaft assembly 218 includes a shaft 224 and a flexure coupling 226. The shaft 224 and the flexure coupling 226 include first and second central channels 228, 230, respectively, which together form the central opening 222. The flexure coupling 226 is configured to maintain the dielectric disk 202 substantially horizontal during rotation of the electrostatic chuck 200.

A driving assembly 227 is coupled to the shaft assembly 218 to rotate the shaft assembly 218 and the dielectric disk 202. A slip ring 232 (discussed below) is coupled to a first end 234 of the shaft 224 to facilitate coupling power from a power source 236 to various components of the electrostatic chuck 200 such as, for example, one or more chucking electrodes 208, one or more thermocouples 241, etc. In some embodiments, one or more power couplings 243 (first power coupling) may extend through a portion of the slip ring 232 that rotates and into a bottom portion of the shaft 224. The power coupling 243 is electrically coupled to a second power coupling 245 extending through a lower portion of the flexure coupling 226 and into an upper portion of the shaft 224. The flexure coupling 226 is coupled to a second end 242 of the shaft 224 opposite the slip ring 232. In some embodiments, a bearing assembly 233 is disposed about the flexure coupling 226 to provide added support/rigidity for the upper portion of the electrostatic chuck 200, especially during rotation.

A cryogenic supply chamber 244 is coupled to the shaft assembly 218 at a second end 247 of the shaft assembly 218 opposite the first end 220 to supply a cryogenic medium to the dielectric disk 202. The cryogenic medium supplied by the cryogenic supply chamber 244 to the dielectric disk 202 is between about 5 Kelvin and about 293 Kelvin. In some embodiments, the cryogenic medium may be liquid nitrogen, liquid helium mixed refrigerant gases, or the like.

To facilitate the delivery of the cryogenic medium from the cryogenic supply chamber 244 to the dielectric disk 202, a supply tube 246 is coupled to the cryogenic supply chamber 244 at a first end 248 of the supply tube 246 and to the coolant inlet 214 of the cryogenic manifold 212 at a second end 250 of the supply tube 246 to supply the cryogenic medium to the plurality of coolant channels 210. In some embodiments, the supply tube 246 extends through the central opening 222 and is concentric with the shaft assembly 218.

To facilitate the return of the cryogenic medium to the cryogenic supply chamber 244 after the cryogenic medium has flowed through the plurality of coolant channels 210, a return tube 252 is coupled to the coolant outlet 216 of the cryogenic manifold 212 at a first end 254 of the return tube 252 and to the cryogenic supply chamber 244 at a second end 256 of the return tube 252. In some embodiments, and as depicted in FIG. 2A, B, the return tube 252 extends through the central opening 222 and is disposed within and concentric to the supply tube 246. In some embodiments, to minimize or substantially prevent heat transfer between the cryogenic medium flowing through the supply tube 246 and the used cryogenic medium flowing through the return tube 252, a thermally insulative layer 258, as shown in FIG. 2C, may be disposed on the outer surface of the supply tube 246. In some embodiments, the thermally insulative layer 258 may be coating such as, for example, polytetrafluoroethylene, ceramic or the like. In some embodiments, the thermally insulative layer 258 may alternatively be a ceramic tube into which the supply tube 246 is inserted.

The cryogenic supply chamber 244 includes a chamber body 260 defining an interior volume 262. A feedthrough block 264, which is coupled to a chiller 266 for the supply and return of the cryogenic medium, is disposed within the interior volume 262. The feedthrough block 264 includes a feedthrough inlet 268 fluidly coupled to the supply tube 246 and a feedthrough outlet 270 fluidly coupled to the return tube 252. Because the cryogenic medium flowing through the feedthrough block 264 is at such a low temperature, ice or frost can build up on the feedthrough block 264. To avoid such ice buildup, a vacuum pump 272 is fluidly coupled to the interior volume 262 via a vacuum port 274 formed in the chamber body 260 to maintain the interior volume 262 at vacuum pressure. In some embodiments, vacuum pump 272 is a roughing pump configured to maintain the pressure in the interior volume at about rough vacuum pressure. The feedthrough block 264 remains stationary while the supply tube 246 and the return tube 252 rotate.

In some embodiments, the electrostatic chuck 200 may further include a sealing tube 276 coupled to a lower portion of the return tube 252 and concentric to the return tube 252. The sealing tube 276 is configured to seal off the effective volume of the cryogenic supply chamber 244, which is at a rough vacuum pressure, from the processing volume (e.g., processing volume 119), which is at a processing pressure. To achieve such a seal, the sealing tube 276 includes a ceiling portion 278 which is coupled to the lower portion of the return tube 252 and an open bottom end 280. In some embodiments, the ceiling portion 278 is welded to the return tube 252. The return tube 252 extends through a portion of the sealing tube 276 and terminates at a point within the sealing tube 276. In some embodiments, an annular seal 261 may be disposed about a bottom portion of the sealing tube 276 to isolate the roughing vacuum environment beneath the annular seal 261 from the process vacuum environment above the annular seal 261.

In some embodiments, a bellows 282 is coupled to a lowermost surface 284 of the return tube 252 and disposed within the sealing tube 276. The bellows 282 fluidly couples the return tube 252 to the feedthrough outlet 270. The bellows 282 is configured to compensate for the thermal expansion of the return tube 252, for any misalignment of the return tube 252 with respect to the supply tube 246, and for any slack resulting from inertia caused by the rotation of the electrostatic chuck 200. In some embodiments, the bellows 282 is formed of stainless steel.

To facilitate transmission of the cooling to a substrate disposed atop the dielectric disk 202, the electrostatic chuck 200 further includes a backside gas delivery system 286 fluidly coupled to the dielectric disk 202 to supply a backside gas to a plurality of backside gas outlets 288 formed through the support surface 204 proximate a periphery of the dielectric disk 202. In some embodiments, the backside gas delivery system 286 includes a rotary feedthrough 290 disposed about and concentric with the shaft 224, a backside gas conduit 292 coupled to the second end 242 of the shaft 224, and a backside gas manifold 294 coupled to the backside gas conduit 292 opposite the shaft 224. The rotary feedthrough 290 includes a housing 251 that is stationary and a cylindrical portion 253 disposed within the housing and that is rotatable. Two annular bearing assemblies 255, 257 are disposed between the housing 251 and the cylindrical portion 253. The rotary feedthrough 290 further includes a backside gas coupling 296 to facilitate coupling a backside gas supply to the rotary feedthrough 290. The backside gas manifold 294 is disposed between the cryogenic manifold 212 and the flexure coupling 226 and includes a manifold channel 298, which, together with a corresponding conduit 299 formed in the cryogenic manifold 212 and aligned with the manifold channel 298, fluidly couple the backside gas conduit 292 with a backside gas inlet 203 in the dielectric disk 202. The shaft 224 includes a backside gas channel 265 to fluidly couple the backside gas coupling 296 to the backside gas conduit 292.

In some embodiments, the shaft 224 includes an annular recess 229 formed in an outer surface 231 of the shaft 224 and is disposed adjacent to the backside gas coupling 296. The backside gas channel 265 fluidly couples the annular recess 229 to the backside gas conduit 292 so that backside gas flow from the backside gas coupling 296, into the annular recess 229, through the backside gas channel 265 of the shaft 224, through the backside gas conduit 292, through the backside gas inlet 203, and through the a plurality of backside gas outlets 288. To prevent leakage of the backside gas, a first annular seal 239 disposed above the backside gas coupling 296 and a second annular seal 249 disposed below the backside gas coupling 296, both of which are disposed between the housing 251 and the cylindrical portion 253. In some embodiments, the first and second annular sealing elements 239, 249 are ferrofluidic seals. In addition, a third annular sealing element 235 is disposed about the shaft 224 above the backside gas coupling 296 and a fourth annular sealing element 237 disposed about the shaft 224 below the backside gas coupling 296 to fluidly isolate the roughing vacuum pressure environment below the third and fourth annular sealing elements 235, 237 from the process vacuum pressure environment above the third and fourth annular sealing elements 235, 237.

To control the cooling rate of a substrate disposed atop the dielectric disk 202, the flow rate of the backside gas and the clamping force provided by the chucking electrode are controlled to achieve a desired pressure beneath the substrate and clamping of the substrate that result in the desired cooling rate. One or more thermocouples 241 may monitor the temperature of the dielectric disk 202. The supply of cryogenic medium to the plurality of coolant channels 210 and the flow rate of the backside gas is controlled based on the temperature readings provided by the thermocouple 241.

While the foregoing is directed to embodiments of the present disclosure, other and further embodiments of the disclosure may be devised without departing from the basic scope thereof.

The invention claimed is:
1. An electrostatic chuck, comprising:
a dielectric disk having a support surface to support a substrate and an opposing second surface, wherein at least one chucking electrode is disposed within the dielectric disk between the support surface and the second surface, and wherein a plurality of coolant channels are disposed entirely within the dielectric disk;
a cryogenic manifold coupled to the second surface of the dielectric disk beneath the cooling channels and having a coolant inlet and a coolant outlet both of which are fluidly coupled to the plurality of coolant channels;
a shaft assembly coupled to the cryogenic manifold at a first end of the shaft assembly, wherein the shaft assembly includes a central opening extending through the shaft assembly, wherein the shaft assembly includes a flexure coupling at the first end of the shaft assembly and a shaft coupled to the flexure coupling, wherein the flexure coupling and the shaft are configured to maintain the dielectric disk substantially horizontal during rotation;
a backside gas manifold disposed between the cryogenic manifold and the flexure coupling, the backside gas manifold having a manifold channel aligned with a corresponding conduit formed in the cryogenic manifold to fluidly couple a backside gas conduit with a backside gas inlet in the dielectric disk;
a cryogenic supply chamber coupled to the shaft assembly at a second end of the shaft assembly opposite the first end;
a supply tube coupled to the cryogenic supply chamber at a first end of the supply tube to receive a cryogenic medium and to the coolant inlet at a second end of the supply tube to supply the cryogenic medium to the plurality of coolant channels, wherein the supply tube extends through the central opening and is concentric with the shaft assembly;

a return tube coupled to the coolant outlet at a first end of the return tube and to the cryogenic supply chamber at a second end of the return tube to return the cryogenic medium to the cryogenic supply chamber after the cryogenic medium has flowed through the plurality of coolant channels, wherein the return tube extends through the central opening and is concentric with the supply tube, and wherein the supply tube is disposed within the return tube and the backside gas conduit is spaced outside from the supply tube;

a bearing assembly disposed about the flexure coupling and disposed vertically between the flexure coupling and the dielectric disk; and a driving assembly coupled to the shaft assembly configured to rotate the shaft assembly and the dielectric disk.

2. The electrostatic chuck of claim 1, further comprising: a slip ring coupled to the shaft at an end of the shaft opposite the flexure coupling to facilitate coupling power from a power source to the at least one chucking electrode.

3. The electrostatic chuck of claim 1, further comprising a housing having a dish-like shape disposed about the dielectric disk and the cryogenic manifold.

4. The electrostatic chuck of claim 1, further comprising:
a backside gas delivery system fluidly coupled to the dielectric disk, wherein the backside gas delivery system comprises:
   a rotary feedthrough disposed about and concentric with the shaft and having a backside gas coupling, wherein the rotary feedthrough includes a stationary housing and a rotatable cylindrical portion disposed within the stationary housing, and wherein two annular bearing assemblies are disposed between the stationary housing and the rotatable cylindrical portion;
   the backside gas conduit coupled to the second end of the shaft; and
   the backside gas manifold coupled to the backside gas conduit opposite the shaft, wherein a backside gas channel is formed through the shaft to fluidly couple the backside gas coupling to the backside gas conduit.

5. The electrostatic chuck of claim 4, wherein the shaft includes an annular recess formed in an outer surface of the shaft, wherein the annular recess is disposed adjacent to the backside gas coupling, and wherein the backside gas channel fluidly couples the annular recess to the backside gas conduit.

6. The electrostatic chuck of claim 4, further comprising:
a first annular sealing element disposed between the stationary housing and the rotatable cylindrical portion above the backside gas coupling; and
a second annular sealing element disposed between the stationary housing and the rotatable cylindrical portion below the backside gas coupling,
wherein the first and second annular sealing elements are configured to prevent leakage of backside gases supplied through the backside gas coupling.

7. The electrostatic chuck of claim 1, wherein the cryogenic supply chamber comprises:
a chamber body defining an interior volume; and
a feedthrough block having a feedthrough inlet fluidly coupled to the supply tube and a feedthrough outlet fluidly coupled to the return tube.

8. The electrostatic chuck of claim 7, further comprising:
a vacuum pump fluidly coupled to the interior volume via a vacuum port formed in the chamber body to maintain the interior volume at vacuum pressure.

9. The electrostatic chuck of claim 7, further comprising:
a sealing tube coupled to a lower portion of the return tube and disposed concentric to the return tube, wherein the return tube extends through a portion of the sealing tube, wherein the sealing tube includes a ceiling portion and an open bottom end, and wherein the ceiling portion is coupled to the lower portion of the return tube to seal off an effective volume of the cryogenic supply chamber.

10. The electrostatic chuck of claim 9, further comprising:
bellows coupled to a lowermost surface of the return tube and disposed within the sealing tube, wherein a volume within the bellows is fluidly coupled to the feedthrough outlet.

11. The electrostatic chuck of claim 10, wherein the bellows is formed of stainless steel and is welded to the lowermost surface of the return tube.

12. The electrostatic chuck of claim 1, further comprising:
a thermally insulative layer disposed on an outer surface of the supply tube.

13. An electrostatic chuck, comprising:
a dielectric disk having a support surface to support a substrate and an opposing second surface, wherein at least one chucking electrode is disposed within the dielectric disk between the support surface and the second surface, and wherein a plurality of coolant channels are entirely disposed within the dielectric disk;

a cryogenic manifold coupled to the second surface of the dielectric disk beneath the plurality of cooling channels and having a coolant inlet and a coolant outlet both of which are fluidly coupled to the plurality of coolant channels, wherein the cryogenic manifold has an outermost diameter less than an outermost diameter of the dielectric disk;

a shaft assembly coupled to the cryogenic manifold at a first end of the shaft assembly, wherein the shaft assembly includes a central opening extending through the shaft assembly, and wherein the shaft assembly includes a flexure coupling at the first end of the shaft assembly and a shaft coupled to the flexure coupling;

a backside gas conduit coupled to a backside gas inlet in the dielectric disk;

a cryogenic supply chamber coupled to the shaft assembly at a second end of the shaft assembly opposite the first end;

a vacuum pump fluidly coupled to the cryogenic supply chamber to maintain the cryogenic supply chamber at vacuum pressure;

a supply tube coupled to the cryogenic supply chamber at a first end of the supply tube to receive a cryogenic medium and to the coolant inlet at a second end of the supply tube to supply the cryogenic medium to the plurality of coolant channels, wherein the supply tube extends through the central opening and is concentric with the shaft assembly;

a thermally insulative layer disposed on an outer surface of the supply tube;

a return tube coupled to the coolant outlet at a first end of the return tube and to the cryogenic supply chamber at a second end of the return tube to return the cryogenic medium to the cryogenic supply chamber after the cryogenic medium has flowed through the plurality of coolant channels, wherein the return tube extends through the central opening and is concentric with the supply tube, and wherein the supply tube is disposed within the return tube and the backside gas conduit is spaced outside from the supply tube;

a bearing assembly disposed about the flexure coupling and disposed vertically between the flexure coupling and the dielectric disk;

a slip ring coupled to the second end of the shaft assembly to facilitate coupling power from a power source to the at least one chucking electrode; and a driving assembly coupled to the shaft assembly to rotate the shaft assembly and the dielectric disk.

14. The electrostatic chuck of claim 13, further comprising:

a bearing assembly disposed about the flexure coupling.

15. The electrostatic chuck of claim 13, further comprising:

a backside gas delivery system fluidly coupled to the dielectric disk, wherein the backside gas delivery system comprises:

a rotary feedthrough disposed about and concentric with the shaft and having a backside gas coupling, wherein the rotary feedthrough includes a stationary housing and a rotatable cylindrical portion disposed within the stationary housing, and wherein two annular bearing assemblies are disposed between the stationary housing and the rotatable cylindrical portion;

the backside gas conduit coupled to the second end of the shaft; and a backside gas manifold coupled to the backside gas conduit opposite the shaft, wherein the backside gas manifold is disposed between the cryogenic manifold and the flexure coupling, and wherein the backside gas manifold includes a manifold channel to fluidly couple the backside gas conduit with a backside gas inlet in the dielectric disk, wherein a backside gas channel is formed through the shaft to fluidly couple the backside gas coupling to the backside gas conduit.

16. The electrostatic chuck of claim 15, wherein the shaft includes an annular recess formed in an outer surface of the shaft, wherein the annular recess is disposed adjacent to the backside gas coupling, and wherein the backside gas channel fluidly couples the annular recess to the backside gas conduit.

17. A process chamber, comprising:

a chamber body having an interior volume; and the electrostatic chuck of claim 1 disposed within a lower portion of the interior volume.

18. The process chamber of claim 17, further comprising:

a chiller coupled to the cryogenic supply chamber to supply cryogenic medium to the electrostatic chuck via the cryogenic supply chamber.

* * * * *